(12) United States Patent  
Tsuchiya

(10) Patent No.: US 9,013,614 B2  
(45) Date of Patent: Apr. 21, 2015

(54) SOLID-STATE IMAGE PICKUP APPARATUS AND METHOD OF PRODUCING THE SAME

(71) Applicant: Canon Kabushiki Kaisha, Tokyo (JP)

(72) Inventor: Masayuki Tsuchiya, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 183 days.

(21) Appl. No.: 13/750,410

(22) Filed: Jan. 25, 2013

(65) Prior Publication Data

US 2013/0194473 A1     Aug. 1, 2013

(30) Foreign Application Priority Data

Jan. 31, 2012  (JP) ................................. 2012-018418

(51) Int. Cl.
  H04N 3/14      (2006.01)
  H01L 31/0232   (2014.01)
  H04N 5/374     (2011.01)
  H01L 31/18     (2006.01)
  H01L 27/146    (2006.01)

(52) U.S. Cl.
  CPC ............ *H01L 31/0232* (2013.01); *H04N 5/374* (2013.01); *H01L 31/18* (2013.01); *H01L 27/14603* (2013.01); *H01L 27/1461* (2013.01); *H01L 27/1462* (2013.01); *H01L 27/14689* (2013.01)

(58) Field of Classification Search
  CPC ................................................ H01L 27/14689
  USPC ...................... 348/294, 308; 438/69; 257/432
  See application file for complete search history.

(56) References Cited

U.S. PATENT DOCUMENTS

| 2010/0181602 A1* | 7/2010 | Oishi ............................ 257/225 |
| 2010/0193914 A1* | 8/2010 | Nakamura .................... 257/618 |
| 2012/0267742 A1* | 10/2012 | Yano ............................ 257/432 |
| 2014/0210033 A1* | 7/2014 | Yano et al. .................... 257/432 |

FOREIGN PATENT DOCUMENTS

| JP | 2000-12822 A   | 1/2000  |
| JP | 2009-38309 A   | 2/2009  |
| JP | 2010-205951 A  | 9/2010  |
| JP | 2010-232284 A  | 10/2010 |
| JP | 2010-251800 A  | 11/2010 |

* cited by examiner

*Primary Examiner* — Mekonnen Dagnew  
(74) *Attorney, Agent, or Firm* — Canon USA, Inc. IP Division

(57) ABSTRACT

In a solid-state image pickup apparatus, a first insulating film continuously extends over at least part of a photoelectric conversion element and at least part of a gate electrode and further protrudes into a region above part of a floating diffusion region. A second insulating film is disposed above the first insulating film. The first insulating film has a higher dielectric constant than the second insulating film. An end of a part of the first insulating film protruding beyond an end of the gate electrode into the region above the floating diffusion region is located at a distance of 0.25 µm or less from an end, on a side of the floating diffusion region, of the gate electrode.

6 Claims, 8 Drawing Sheets

SOLID-STATE IMAGE PICKUP APPARATUS AND METHOD OF PRODUCING THE SAME

BACKGROUND OF THE INVENTION

1. Field of the Invention

The present invention relates to a solid-state image pickup apparatus and a method of producing the same.

2. Description of the Related Art

Japanese Patent Laid-Open No. 2000-12822 discloses a CMOS-type solid-state image pickup apparatus having an antireflection coating disposed over a photodetection unit. The antireflection coating extends from the photodetection unit to above a transfer gate electrode such that an end face of the antireflection coating is located above the transfer gate electrode. A side spacer is disposed on a sidewall, on a side of the detection unit, i.e., on a side of the floating diffusion region (hereinafter referred to as the FD region), of the transfer gate electrode. Japanese Patent Laid-Open No. 2009-38309 discloses a CMOS-type solid-state image pickup apparatus including a member that covers a region above a photodiode and a region above a gate electrode of a transfer transistor and further extends to an FD region.

SUMMARY OF THE INVENTION

According to an embodiment of the invention, an solid-state image pickup apparatus includes a photoelectric conversion element, a floating diffusion region, a contact plug electrically connecting the floating diffusion region to an input node of an amplifying unit, a gate electrode disposed between the photoelectric conversion element and the floating diffusion region and configured to control an electrical conduction between the photoelectric conversion element and the floating diffusion region, a first insulating film continuously extending over at least part of the photoelectric conversion element and at least part of the gate electrode and further protruding into a region above part of the floating diffusion region, and a second insulating film disposed above the first insulating film and continuously extending over the photoelectric conversion element, the gate electrode, and the floating diffusion region, wherein the first insulating film has a higher dielectric constant than the second insulating film, and an end of the first insulating film protruding from above the gate electrode into the region above the part of the floating diffusion region is located such that a distance of the end of the first insulating film from an end, on a side of the floating diffusion region, of the gate electrode is in a range equal to or less than 0.25 µm.

According to an embodiment, there is provided a method of producing a solid-state image pickup apparatus including a photoelectric conversion element, a floating diffusion region, and a gate electrode configured to control an electrical conduction between the photoelectric conversion element and the floating diffusion region, the method including forming an insulating film above the photoelectric conversion element, the gate electrode, and the floating diffusion region, forming a resist pattern continuously covering the photoelectric conversion element, the gate electrode, and part of a region above the floating diffusion region, the resist pattern having an opening above part of the floating diffusion region, etching the insulating film using the resist pattern as a mask thereby forming a first insulating film, and forming a second insulating film above the first insulating film, the second insulating film having a lower dielectric constant than the dielectric constant of the first insulating film, the second insulating film covering the photoelectric conversion element, the gate electrode, and the floating diffusion region.

Further features of the present invention will become apparent from the following description of exemplary embodiments with reference to the attached drawings.

DESCRIPTION OF THE EMBODIMENTS

Figure 1A:
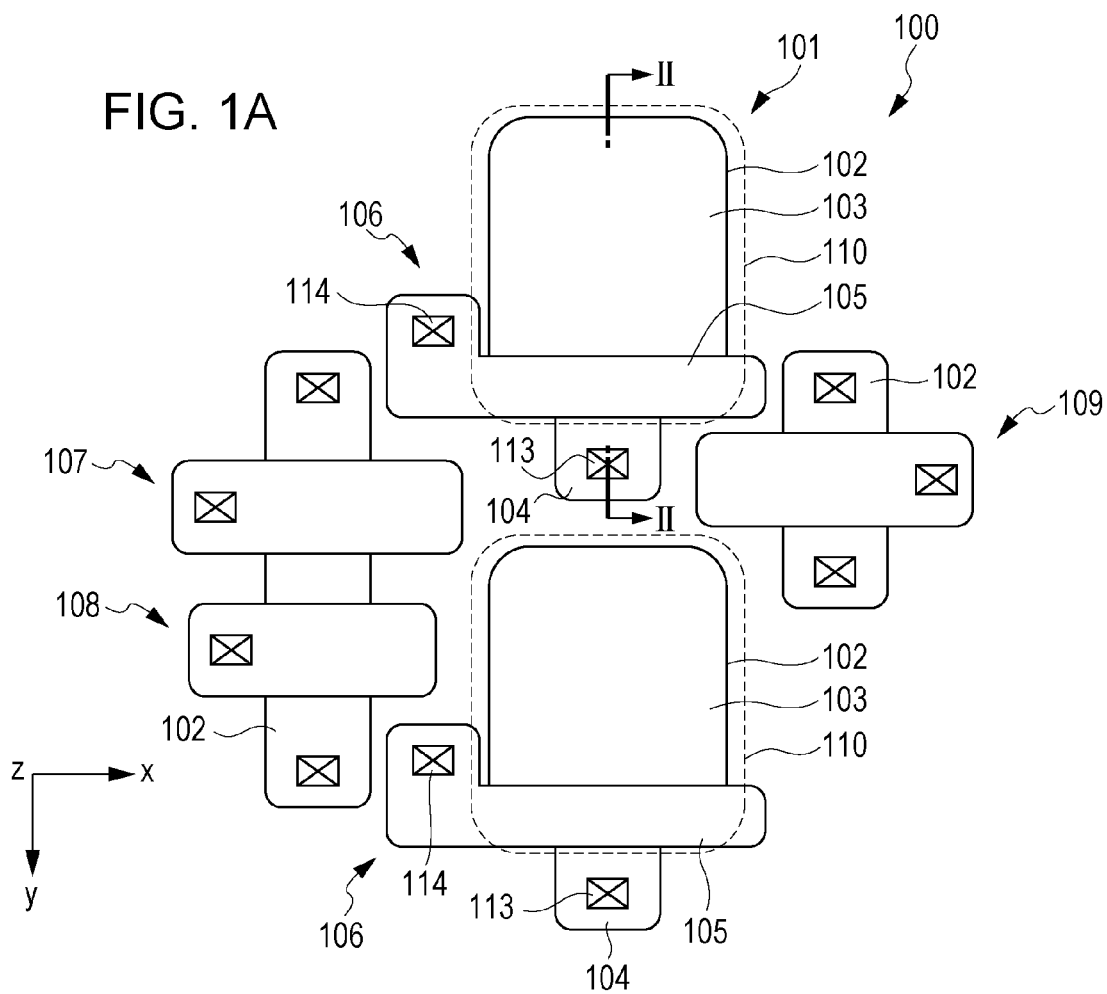
FIG. 1A is a schematic plan view for use in illustrating a solid-state image pickup apparatus according to a first exemplary embodiment.

In the solid-state image pickup apparatus disclosed in Japanese Patent Laid-Open No. 2000-12822, there is a possibility that a transfer gate electrode is damaged when etching is performed to form the side spacer.

Furthermore, a registration error may occur when a contact hole for a contact plug connecting to the FD region is formed in an interlayer film. The registration error may cause the contact hole to be incorrectly disposed at a location in contact with or above the transfer gate electrode. In the solid-state image pickup apparatus disclosed in Japanese Patent Laid-Open No. 2000-12822, the transfer gate electrode is in direct contact, on a side of the FD region, with an interlayer film, and thus the transfer gate electrode may be damaged during an etching process. Furthermore, there is a possibility that a contact plug, which is to be connected to the FD region, is incorrectly connected to the transfer gate electrode.

In Japanese Patent Laid-Open No. 2009-38309, no discussion is given on materials for elements. Depending on materials, it may be difficult to suppress etching damage. Furthermore, depending on materials, high dielectric constant may cause the FD region to have high capacitance, which may result in degradation in image quality.

In view of the above, embodiments of the invention provide a solid-state image pickup apparatus capable of providing improved image quality and a method of producing such as solid-state image pickup apparatus.

According to embodiments of the invention, a solid-state image pickup apparatus includes a first insulating film continuously extending over at least part of a photoelectric conversion element and at least part of a gate electrode and further extending above part of a floating diffusion region. The solid-state image pickup apparatus also includes a second insulating film disposed on the first insulating film and continuously extending to above part of the floating diffusion region. The first insulating film is higher in dielectric constant than the second insulating film. The first insulating film protrudes from above the gate electrode into the region above the floating diffusion region within a range of 0.25 μm or less from an end, on a side of the floating diffusion region, of the gate electrode. By configuring the solid-state image pickup apparatus in this manner, it becomes possible to suppress an increase in capacitance of the FD region.

Exemplary embodiments are described in detail below. In the exemplary embodiments described below, a CMOS-type solid-state image pickup apparatus is taken as an example, and it is assumed by way of example that a signal charge is provided by electrons. Note that the invention is not limited to the CMOS-type solid-state image pickup apparatus. Also note that a signal charge may be provided by holes by inverting a conductivity type, a voltage polarity, etc.

First Exemplary Embodiment

A solid-state image pickup apparatus according to a first exemplary embodiment is described below with reference to FIG. 1A, FIG. 1B, and FIG. 2.

FIG. 1A is a schematic plan view for use in explaining the solid-state image pickup apparatus according to the present embodiment. More specifically, FIG. 1A illustrates two photodiodes (photoelectric conversion elements) 103 and a plurality of transistors for use in reading out signal charges from the photoelectric conversion elements. The plurality of transistors include, for example, a transfer transistor 106 for transferring a signal charge of the photodiode 103 and an amplifying transistor 107 for amplifying a voltage based on the signal charge and reading out the voltage as a signal. The plurality of transistors further include a selection transistor 108 for selectively outputting the signal from the amplifying transistor to a signal line, and a reset transistor 109 for resetting an input node of the amplifying transistor. An FD region 104 serving as a drain of the transfer transistor 106 is electrically connected to a gate electrode, which is as an input node, of the amplifying transistor 107, and a source of the reset transistor 109. Note that the circuit configuration is not limited to that described above. For example, the amplifying transistor may be replaced with an amplifying unit including a plurality of transistors.

The elements described above are disposed in an active region 102 such that each element is isolated by an element isolation region 101 from each other. The photodiode 103 and the FD region 104 serving as the drain of the transfer transistor 106 are disposed in the active region 102. A transfer gate electrode 105 serving as a gate electrode of the transfer transistor is disposed between the photodiode 103 and the FD region 104 such that the transfer gate electrode 105 controls an electrical conduction between the photodiode 103 and the FD region 104. A signal charge is transferred to the FD region 104. An electric potential based on an electric potential of the FD region 104 is amplified and output by the amplifying transistor 107. An insulating member 110 is disposed on arbitrary elements. In the figure, dotted lines indicate locations where the insulating member 110 is disposed. More specifically, the insulating member 110 is formed so as to continuously extend over each at least part of photodiode 103 and at least of part of the transfer gate electrode 105 and further protrude into a region above part of the FD region 104. The insulating member 110 may be disposed over an entire surface of the photodiode 103 and an entire surface of the transfer gate electrode 105. In the example illustrated in FIG. 1A, two photodiode 103 share one amplifying transistor, one selection transistor, and one reset transistor. Note that the configuration is not limited to that illustrated herein. FIG. 1A also illustrates a contact 113 disposed in the FD region 104, a contact 114 disposed in a wiring part contiguously extending from the transfer gate electrode 105, and other contacts (denoted by no reference symbol).

Figure 1B:
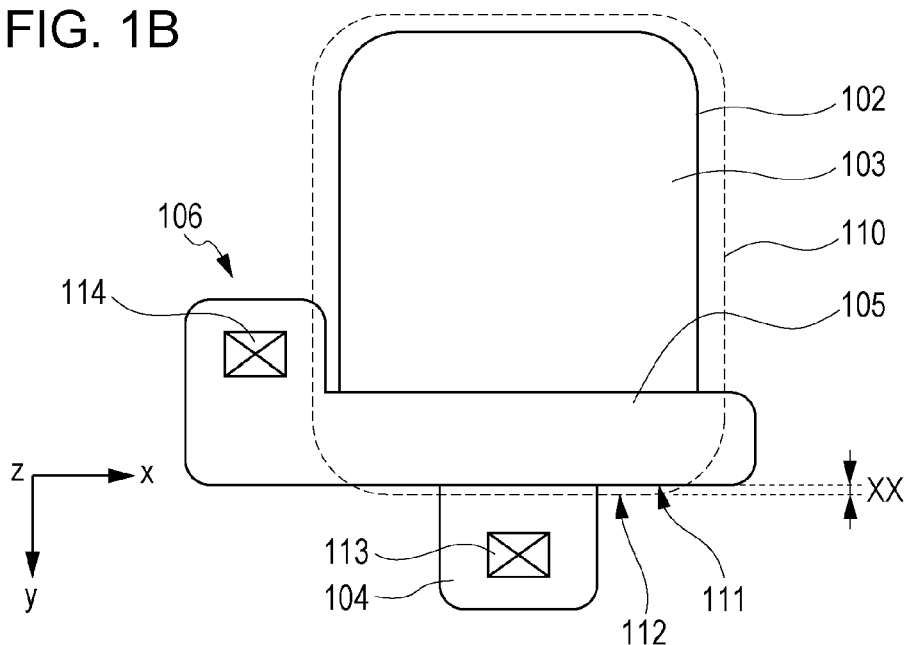
FIG. 1B is a schematic plan view for use in illustrating the solid-state image pickup apparatus according to the first exemplary embodiment.

FIG. 1B is a schematic plan view illustrating, in an enlarged fashion, one of the photodiodes illustrated in FIG. 1A. In FIG. 1B, an end 112, on a side of the FD region 104, of the insulating member 110 is at a location protruding into the FD region 104 by a length XX beyond an end 111, on the side of the FD region 104, of the transfer gate electrode 105. When the length XX is seen in a plane parallel to the surface of the semiconductor substrate, i.e., when seen in a planar layout, the length XX is equal to a length along which the insulating member 110 extends on the FD region 104 from the end 111, on the side of the FD region 104, of the transfer gate electrode 105. Note that the length is measured in a direction (y direction) along a channel length of the transfer transistor. The length XX may also be regarded as a protruding amount of the insulating member 110 into the FD region 104 beyond the edge of the transfer gate electrode 105. That is, the insulating member 110 protrudes (i.e., further extends) from the transfer gate electrode 105 into the FD region 104 by the length XX. Note that the end 111 is a side face of the transfer gate electrode 105, and the end 112 is a side face of the insulating member 110.

Figure 2:
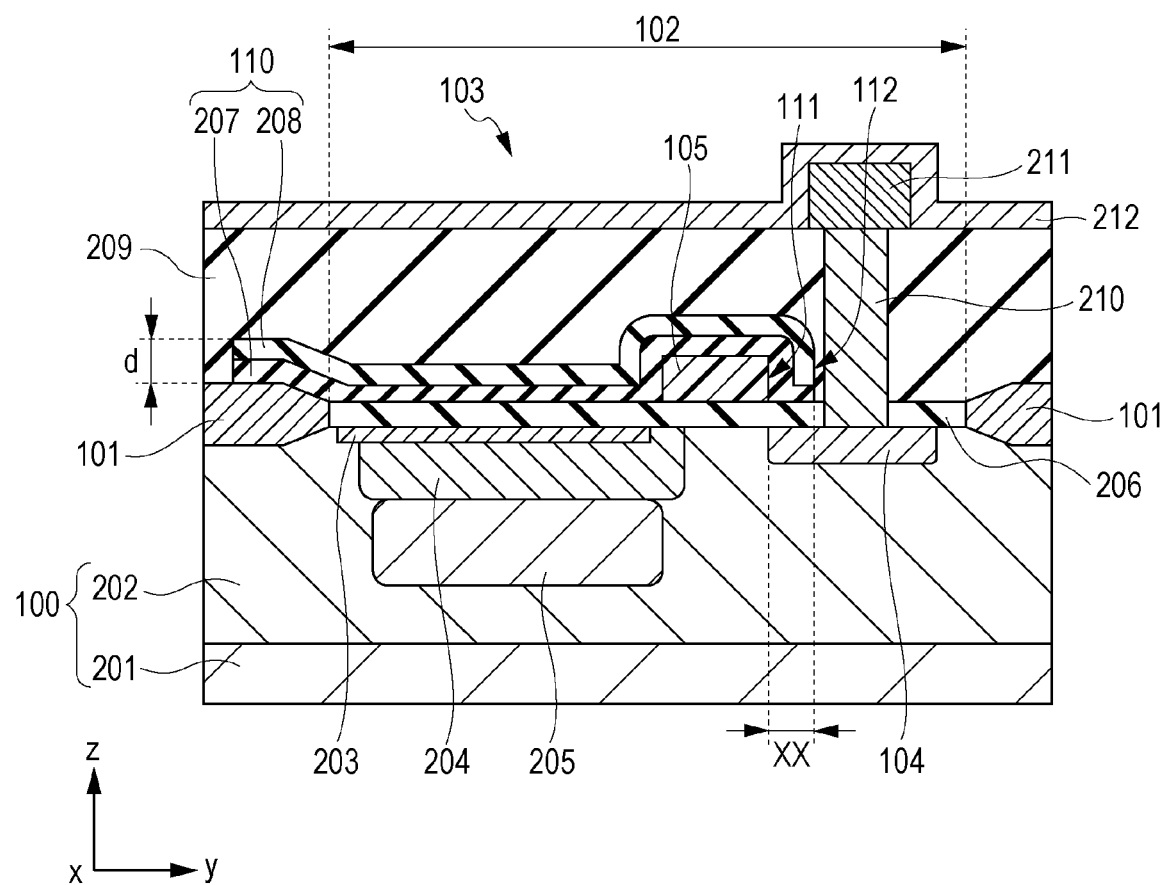
FIG. 2 is a schematic cross-sectional view for use in illustrating the solid-state image pickup apparatus according to the first exemplary embodiment.

FIG. 2 is a schematic cross-sectional view taken along line II-II of FIG. 1A. That is, FIG. 2 is a schematic cross-sectional view of a region including one photodiode 103, one transfer gate electrode 105, and one FD region 104. In FIG. 2, elements similar to those in FIG. 1A or FIG. 1B are denoted by similar reference symbols, and a further detailed description thereof is omitted. In FIG. 2, the semiconductor substrate 100 is, for example, an N-type silicon substrate and includes an N-type semiconductor region 201 and a P-type semiconductor region 202. The P-type semiconductor region 202 may function as a so-called P-type well. A silicon oxide film or the like serving as an element isolation region 101 is disposed on the semiconductor substrate 100. In an active region 102 formed in the semiconductor region 202 such that the active region 102 is isolated by the element isolation region 101, there are disposed elements forming the photodiode 103, i.e., a P-type semiconductor region 203, an N-type semiconductor region 204, and an N-type semiconductor region 205. The semiconductor region 203 is a semiconductor region for realizing the photodiode 103 in the form of an embedded-type photodiode. The semiconductor region 204 and the semiconductor region 205 may function as an accumulation region in which a signal charge is accumulated. The FD region 104 is disposed separately apart from the photodiode 103. The FD region 104 includes an N-type semiconductor region. The N-type semiconductor region is disposed between the photodiode 103 and the FD region 104 and on the gate insulating film 206. The gate insulating film 206 extends from under the transfer gate electrode 105 to the above the photodiode 103 and to above the FD region 104. The insulating member 110 extends from above the element isolation region 101 directly adjacent to the photodiode 103 toward the photodiode 103 and further extends over the photodiode 103 such that the photodiode 103 is covered with the insulating member 110. The insulating member 110 covers a side face, on a side of the photodiode 103, of the transfer gate electrode 105 and also covers an upper surface of the transfer gate electrode 105 and a side face, on a side of the FD region 104, of the transfer gate electrode 105, and the insulating member 110 further protrudes into a region above the FD region 104. That is, the insulating member 110 continuously extends in the y direction from above the photodiode 103 to the above the FD region 104. An insulating film 209 is disposed over the insulating member 110 such that the insulating film 209 continuously extends in the y direction from above the photodiode 103 to above the FD region 104. The insulating film 209 includes a silicon oxide-based film, and a contact plug 210 is disposed in an opening of the insulating film 209. The contact plug 210 is a plug for electrically connecting the FD region 104 to a wiring 211 disposed on the insulating film 209. The wiring 211 is electrically connected to an input node of the amplifying unit. Although an insulating film, a wiring, and other elements may be disposed above the wiring 211, a further description thereof is omitted.

The insulating member 110 includes an insulating film 207 with a higher dielectric constant than the dielectric constant of the insulating film 209. In the present embodiment, the insulating member 110 is formed in a multilayer structure including a silicon nitride film serving as the insulating film 207 and a silicon oxide film serving as an insulating film 208 disposed on the insulating film 207. The insulating member 110 may have a substantially constant thickness denoted by d. The insulating film 207 may have a thickness in a range, for example, from 30 nm to 60 nm. The insulating film 208 may have a thickness in a range, for example, from 140 nm to 190 nm. In the following description, by way of example, it is assumed that the thickness of the insulating film 207 is 50 nm, the thickness of the insulating film 208 is 160 nm, and the thickness d is 210 nm. The length XX may be equal to the thickness d. That is, the length XX may be equal to or less than 0.25 μm. Note that the structure of the insulating member 110 is not limited to the multilayer structure, and there is no particular restriction on the material of the insulating member 110. When the multilayer structure is employed, there is no particular restriction on the order of layers.

A further discussion is given below on the length XX. Because the insulating member 110 is higher in dielectric constant than the insulating film 209, increasing the length XX extending above the FD region 104 may cause the FD region 104 to have greater parasitic capacitance. When a signal voltage is V, a signal charge is Q, and the FD region 104 has capacitance C, then V=Q/C and thus increasing in the capacitance C of the FD region 104 may result in a reduction in efficiency of converting the signal charge Q to the signal voltage V. That is, the reduction in efficiency leads to a reduction in signal. Therefore, in obtaining a final signal, it may be necessary to amplify the signal using an amplifier. However, when the signal is amplified, noise is also increased, and thus a reduction in performance of the solid-state image pickup apparatus may occur. In view of the above consideration, it may be advantageous to limit the length XX to 0.25 μm or less to suppress the increase in capacitance of the FD region 104.

Figure 3:
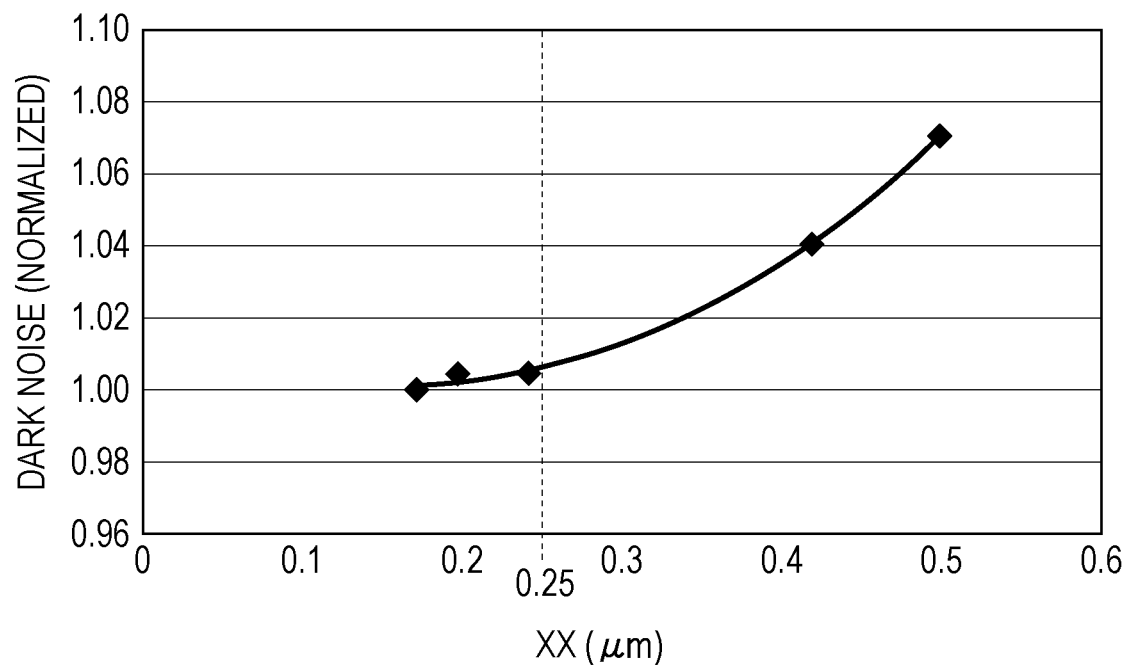
FIG. 3 is a graph for use in illustrating the first exemplary embodiment.

FIG. 3 illustrates a relationship between dark noise and the length XX of the insulating member 110 extending above the FD region 104. The magnitude of the dark noise plotted in the vertical axis is normalized with respect to the magnitude of noise that occurs in a structure in which a side spacer is formed on the transfer gate electrode 105 as in the structure disclosed in Japanese Patent Laid-Open No. 2000-12822. The dark noise is determined based on a signal-to-noise ration calculated from a signal finally output from the solid-state image pickup apparatus. That is, the value of the signal-to-noise ratio is determined for a state in which the final output signal is divided by the amplification gain. In FIG. 3, a horizontal axis represents the length XX (μm) of the insulating member 110. As illustrated in FIG. 3, the dark noise increases with the length XX, and the dark noise is equal to about 1 when the length XX is 0.25 μm. Therefore, by forming the insulating member 110 such that the length XX is equal to or less than 0.25 μm, it is possible to suppress the increase in the capacitance of the FD region 104 and thus suppress the dark noise of the solid-state image pickup apparatus.

Next, referring to FIGS. 4A to 4D, FIGS. 5A to 5D, and FIGS. 6A to 6C, a method of producing the solid-state image pickup apparatus according to an embodiment is described below. Similar elements to those in previous figures are denoted by similar reference symbols, and a further description thereof is omitted. A description is also omitted on processing steps that are possible using techniques which are very common in semiconductor production.

Figure 4A:
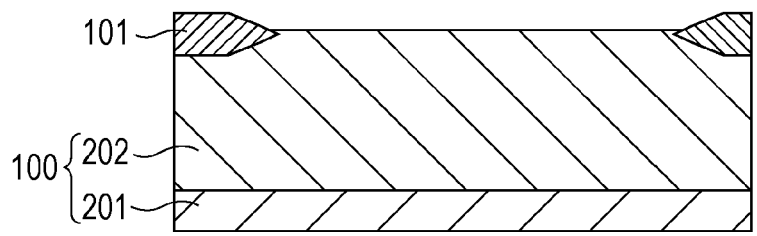
FIG. 4A is a schematic cross-sectional view for use in illustrating a method of producing the solid-state image pickup apparatus according to the first exemplary embodiment.
Figure 4B:
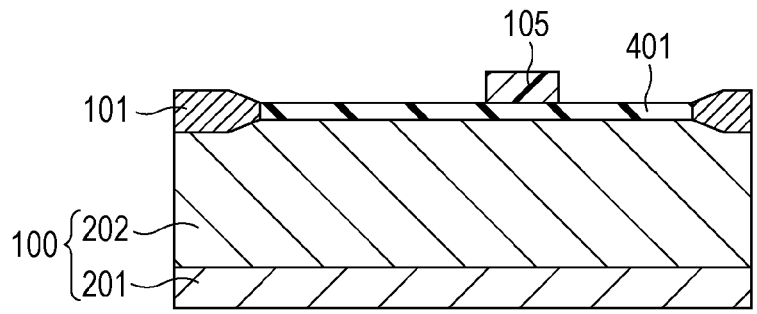
FIG. 4B is a schematic cross-sectional view for use in illustrating the method of producing the solid-state image pickup apparatus according to the first exemplary embodiment.

A semiconductor substrate 100 is prepared as illustrated in FIG. 4A such that the semiconductor substrate 100 has an element isolation region 101 formed thereon. In the present embodiment, the element isolation region 101 is formed using a LOCOS Local Oxidation of Silicon (LOCOS) method. Alternatively, the element isolation region 101 may be formed using a Shallow Trench Isolation (STI) method. Still alternatively, the element isolation region 101 may be formed using a semiconductor region that provides a potential barrier to a signal charge. The semiconductor substrate 100 also includes an N-type semiconductor region 201 and a P-type semiconductor region 202. This structure my be formed, for example, by implanting ions into an N-type semiconductor substrate so as to form a P-type semiconductor region in the N-type semiconductor substrate such that a N-type region of the semiconductor substrate remains as the N-type semiconductor region 201 and the P-type semiconductor region 202 is formed thereon. The ion implantation may be performed one or more times. In a caser where the ion implantation is performed a plurality of times, the implantation energy and the dose of implanted ions may be changed. After the element isolation region 101 is formed, an insulating film 401 to be used as the gate insulating film 206 and the transfer gate electrode 105 are formed (FIG. 4B). The gate insulating film 206 may be obtained, for example, by forming a silicon oxide film by thermally oxidizing the silicon semiconductor substrate. A process such as plasma nitrization may be performed thereafter. The transfer gate electrode 105 may be formed using an electrically conductive material such as polysilicon. The gate electrode is formed on the active region 102 such that it functions as a gate of a transistor. In the present embodiment, a wiring part for supplying a voltage to the gate electrode is also formed such that the wiring part extends from the gate electrode.

Figure 4C:
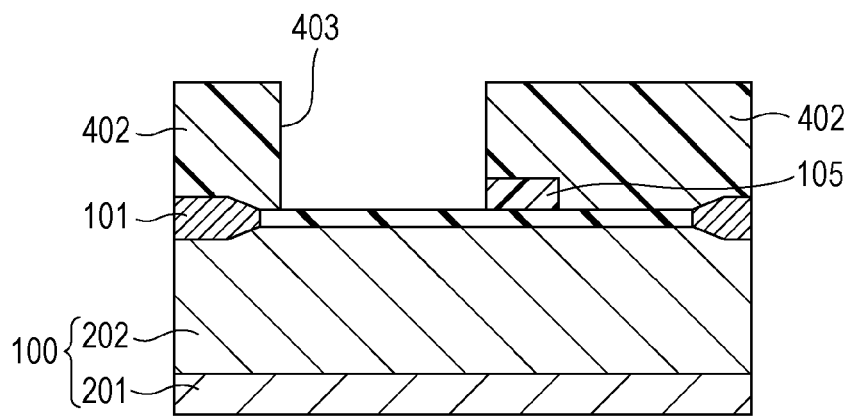
FIG. 4C is a schematic cross-sectional view for use in illustrating the method of producing the solid-state image pickup apparatus according to the first exemplary embodiment.
Figure 4D:
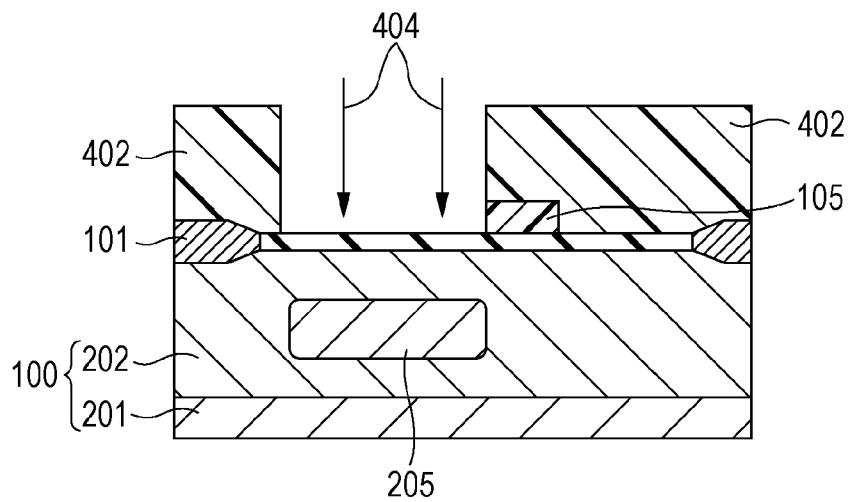
FIG. 4D is a schematic cross-sectional view for use in illustrating the method of producing the solid-state image pickup apparatus according to the first exemplary embodiment.
Figure 5A:
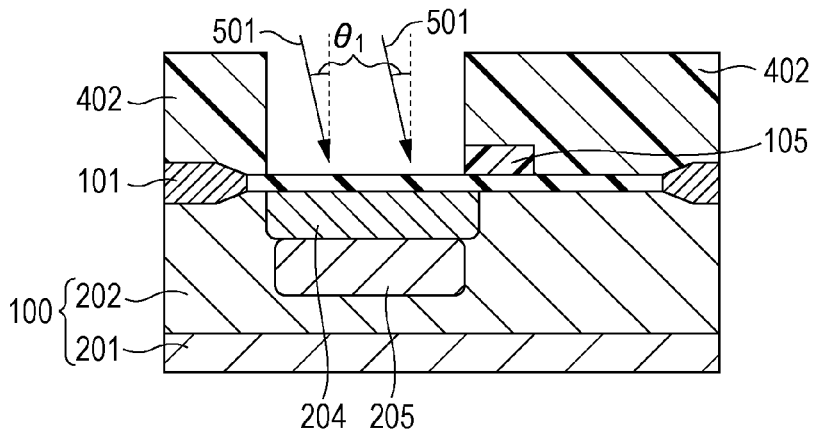
FIG. 5A is a schematic cross-sectional view for use in illustrating the method of producing the solid-state image pickup apparatus according to the first exemplary embodiment.

Thereafter, a resist pattern 402 is formed as illustrated in FIG. 4C. The resist pattern 402 has an opening 403 such that an area where the photodiode 103 is to be formed is exposed via the opening 403. Note that the resist pattern 402 is formed also such that the transfer gate electrode 105 is covered with the resist pattern 402. Ion implantation 404 is then performed into the semiconductor substrate 100 using the resist pattern 402 as an implantation mask (FIG. 4D). As a result of the ion implantation 404, an N-type semiconductor region 205, which is one of elements of the photodiode 103, is formed. The ion implantation 404 may be performed using, for example, arsenic or phosphorus ions at a substantially normal implantation angle. Ion implantation 501 is then performed, as illustrated in FIG. 5A, to form an N-type semiconductor region 204 which is another element of the photodiode 103. The ion implantation 501 may be performed using, for example, arsenic or phosphorus ions in a direction and at an angle $\theta_1$ selected such that the ions horizontally intrude below the transfer gate electrode 105. The angle $\theta_1$ may be in a range from 15 to 50°. Note that the ion implantation 501 is performed with lower ion implantation energy and a lower dose than in the ion implantation 404. As a result, the N-type semiconductor region 204 and the semiconductor region 205 of the photodiode 103 are formed.

Figure 5B:
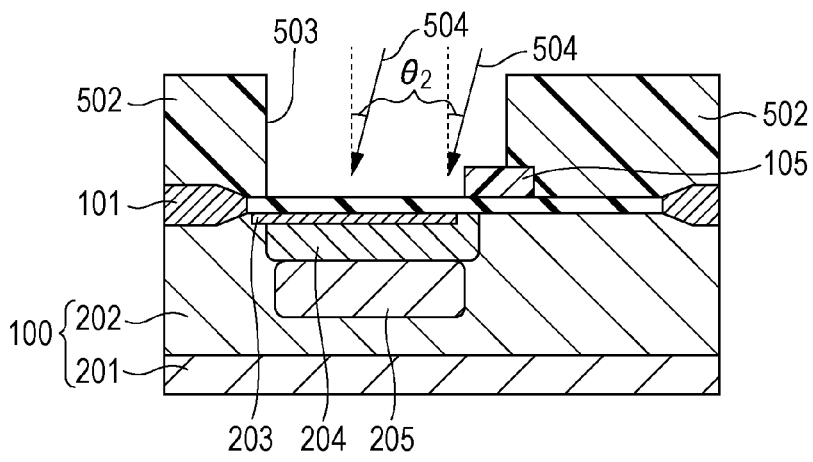
FIG. 5B is a schematic cross-sectional view for use in illustrating the method of producing the solid-state image pickup apparatus according to the first exemplary embodiment.

Thereafter, as illustrated in FIG. 5B, a process is performed to form the P-type semiconductor region 203. First, a resist pattern 502 is formed. The resist pattern 502 has an opening 503 such that an area where the photodiode 103 is to be formed is exposed via the opening 503. Note that the opening 503 is formed also such that part of the area where the photodiode 103 associated with the transfer gate electrode 105 is exposed via the opening 503. Ion implantation 504 is then performed using the resist pattern 502 and the transfer gate electrode 105 as an implantation mask thereby forming the semiconductor region 203. The ion implantation 504 may be performed using, for example, boron ions in a direction and at an angle $\theta_2$ selected so as to produce an implantation shadow at a side of the transfer gate electrode 105. The angle $\theta_2$ may be in a range from 15 to 50°. Note that the ion implantation processes 404, 501, and 504 may be combined with a heat treatment.

Figure 5C:
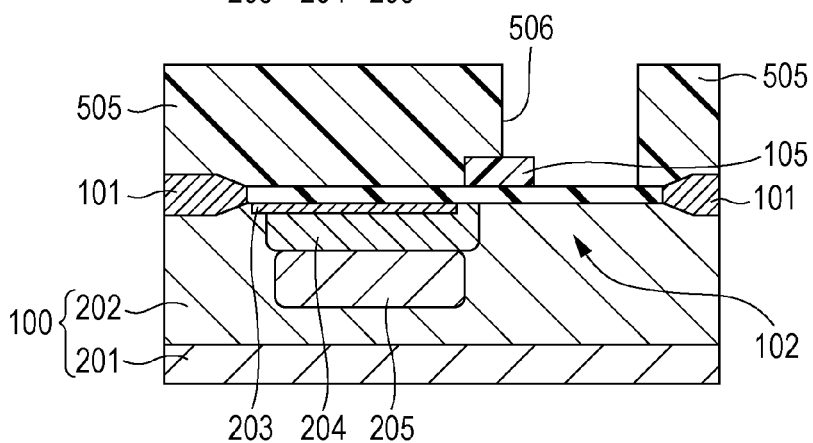
FIG. 5C is a schematic cross-sectional view for use in illustrating the method of producing the solid-state image pickup apparatus according to the first exemplary embodiment.
Figure 5D:
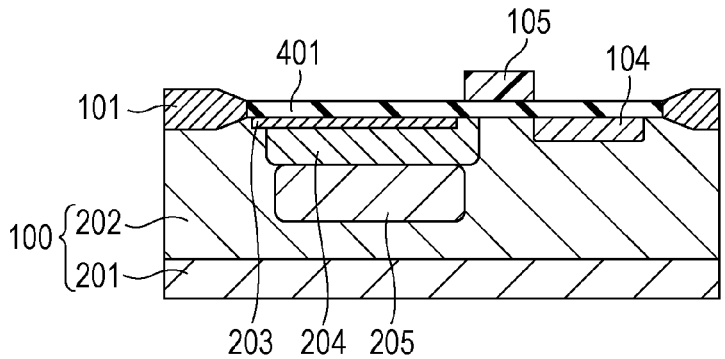
FIG. 5D is a schematic cross-sectional view for use in illustrating the method of producing the solid-state image pickup apparatus according to the first exemplary embodiment.

Thereafter, a process is performed to form the FD region 104. First, as illustrated in FIG. 5C, a resist pattern 505 is formed. The resist pattern 505 has an opening 506 such that an area where the FD region 104 is to be formed is exposed via the opening 506. Note that the resist pattern 505 extends such that the element isolation region 101 and part of the active region 102 including a region in which the FD region 104 is to be formed are covered with the resist pattern 505. The opening 506 is formed such that part of the transfer gate electrode 105, on a side opposite to the photodiode 103, is exposed via the opening 506. Thereafter, for example, phosphorus or arsenic ions are implanted to form an N-type semiconductor region serving as the FD region 104. In the implantation, to suppress the increase in capacitance of the FD region, it may be advantageous to control the impurity concentration of the FD region 104 such that the impurity concentration is equal to or lower than $1\times10^{19}/cm^3$. Using the semiconductor substrate 100 on which the elements have been formed in the above-described manner, a following process is performed. Note that in the following description, any impurity concentration represents a net concentration, i.e., the difference between the N-type impurity concentration and the P-type impurity concentration.

Figure 6A:
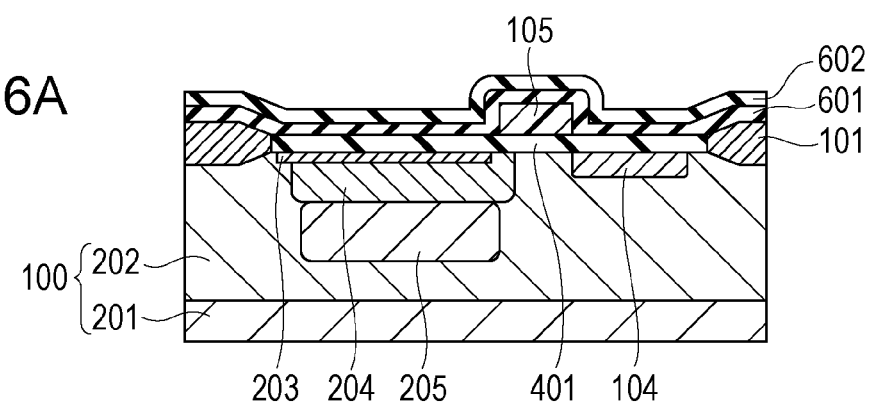
FIG. 6A is a schematic cross-sectional view for use in illustrating the method of producing the solid-state image pickup apparatus according to the first exemplary embodiment.
Figure 6B:
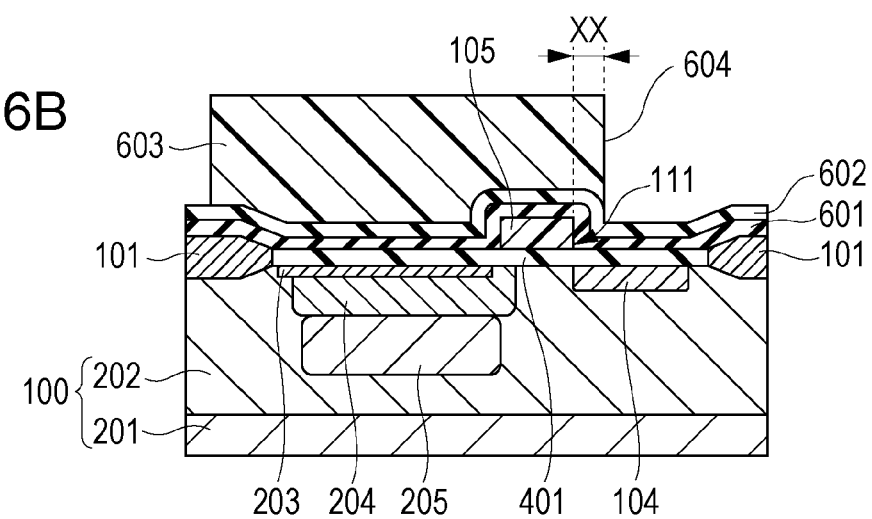
FIG. 6B is a schematic cross-sectional view for use in illustrating the method of producing the solid-state image pickup apparatus according to the first exemplary embodiment.
Figure 6C:
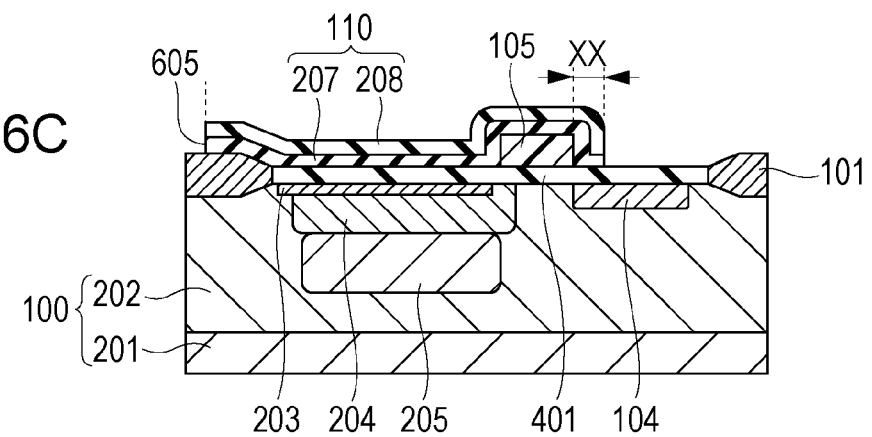
FIG. 6C is a schematic cross-sectional view for use in illustrating the method of producing the solid-state image pickup apparatus according to the first exemplary embodiment.

As illustrated in FIG. 6A, a multilayer structure including a silicon nitride film 601 and a silicon oxide film 602 is formed on the upper surface of the semiconductor substrate 100. Note that the multilayer structure is formed such that a region above the photodiode 103, a side faces and an upper surface of the transfer gate electrode 105, and a region above the FD region 104 are covered with the multilayer structure. Subsequently, a resist pattern 603 is formed as illustrated in FIG. 6B. The resist pattern 603 has an end part that further extends by a length XX in the y direction beyond an end 111, on a side of the FD region 104, of the transfer gate electrode 105. The resist pattern 603 has an opening 604 such that the multilayer structure on the FD region 104 is partially exposed via the opening 604. It may be advantageous to form the opening 604 of the resist pattern 603 such that one of side faces of the opening 604 is located at a length XX as measured from the end 111 of the transfer gate electrode 105 to above the FD region 104. The multilayer structure is then etched using the resist pattern 603 as a mask and the resist pattern 603 is removed after the etching. As a result, an insulating member 110 is formed as illustrated in FIG. 6C. By disposing the resist pattern 603 in the above-described manner, it becomes possible to form the insulating member 110 without forming a side spacer. The end 112 of the insulating member 110 is located such that a length of the end 112 from the end 111 of the transfer gate electrode 105 toward the FD region 104 is in a range of XX. In the present example, an end 605, on a side opposite to the FD region 104, of the insulating member 110 is located above the element isolation region 101, although this location may be selected differently as required.

Thereafter, a silicon oxide-based film such as a BPSG film or the like serving as the insulating film 209 is formed such that the insulating member 110 is covered with the insulating film 209. The insulating film 209 is lower in dielectric constant than the silicon nitride film serving as the insulating film 207. A hole for contact is then formed in the insulating film 209 using an etching process or the like. In this etching process to form the hole, because the insulating film 207 of the insulating member 110 is made of a material different from the material of the insulating film 209, the insulating film 207 may function as an etching stopper film. Because the insulating film 207 covers the upper surface and side faces of the transfer gate electrode 105, even if a registration error occurs in the process of forming the hole, the transfer gate electrode 105 is protected from being etched. A plug is then formed in the hole and a wiring is formed. As a result, a structure illustrated in FIG. 2 is obtained. Subsequently, a wiring, a via, a color filter, and an optical element including a microlens are formed to obtain a complete solid-state image pickup apparatus. In this process, the insulating member 110 including the silicon nitride film serving as the insulating film 207 may function as an etching stopper film in the process when etching is performed to form contact holes in the insulating film 209. Because the side faces and the upper surface of the transfer gate electrode 105 is covered with the insulating member 110, it is possible to prevent the transfer gate electrode 105 from being exposed when the contact holes are formed, which suppresses an occurrence of a short circuit.

As illustrated in FIG. 1A and FIG. 1B, the insulating member 110 is not disposed above a region where a contact of a wiring part continuously extending from the transfer gate electrode 105 is formed, and not disposed above a region in which a contact 113 of the FD region 104 is formed. The insulating member 110 is not disposed also above regions in which contacts of other transistors are formed. By employing such a configuration, it becomes possible to perform etching under the same condition for all contact holes, which allows it to form the contact holes with high accuracy.

As described above, by employing the configuration according to the embodiment, it becomes possible to suppress an increase in capacitance of the FD region. Furthermore, by employing the method of producing the solid-state image pickup apparatus according to the embodiment, it becomes possible to suppress an increase in capacitance of the FD region and it also becomes possible to suppress an occurrence of a short circuit between a contact hole and a transfer gate electrode.

By employing the configuration and the method described above, it becomes possible to prevent a short circuit from occurring between the transfer gate electrode 105 and the FD region 104 and prevent the transfer gate electrode 105 from being damaged. That is, even when a contact hole of a contact connecting to the FD region 104 is formed so as to overlap the transfer gate electrode 105 because of a production error, etching of the contact hole is stopped by the insulating film 208. Furthermore, by limiting the protruding amount (XX) of the insulating film 208 into a region above the FD region 104, it becomes possible to suppress an increase in capacitance of the FD region 104.

Modifications

Examples of modifications to the first exemplary embodiment are described below with reference to FIGS. 7A to 7C and FIGS. 8A to 8D. FIGS. 7A to 7C and FIGS. 8A to 8D are schematic plan views of a solid-state image pickup apparatus corresponding to FIG. 1A, and illustrate modifications to the first exemplary embodiment in terms of locations of photodiodes, the insulating member 110, etc. Note that selection transistors and other elements illustrated in FIG. 1A are not shown in FIGS. 7A to 7C and FIGS. 8A to 8D. In FIGS. 7A to 7C and FIGS. 8A to 8D, similar elements to those in FIG. 1A are denoted by similar reference symbols, and a further description thereof is omitted. In the following description, a discussion is given on configurations including a plurality of element sets each including one photodiode 103, one transfer gate electrode 105, and one FD region 104.

Figure 7A:
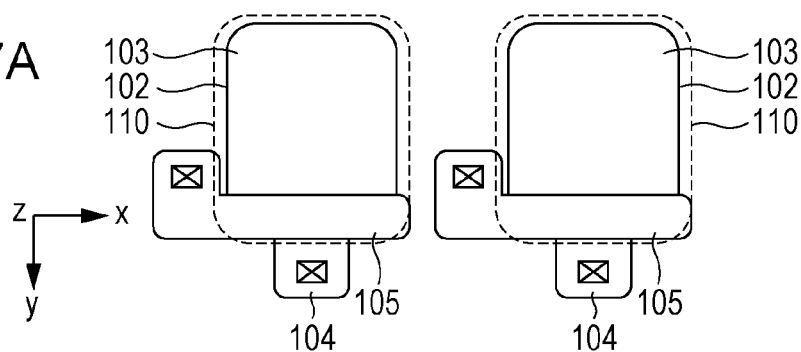
FIG. 7A is a schematic plan view for use in illustrating a modification of the solid-state image pickup apparatus according to the first exemplary embodiment.
Figure 7B:
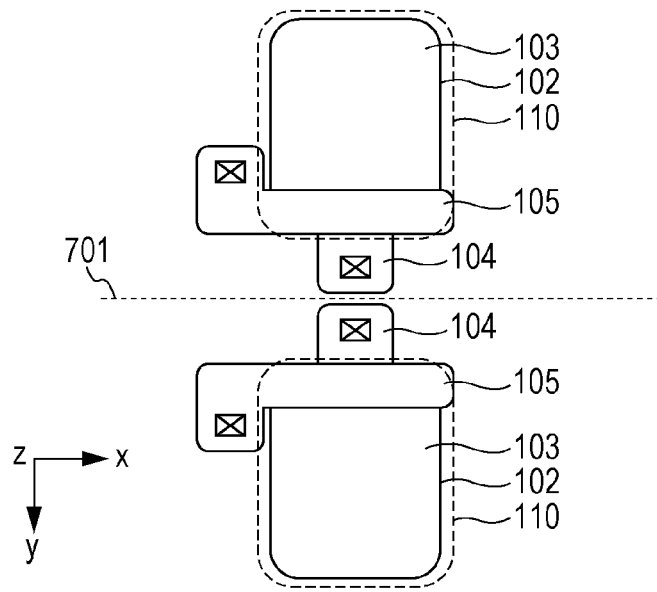
FIG. 7B is a schematic plan view for use in illustrating a modification of the solid-state image pickup apparatus according to the first exemplary embodiment.
Figure 7C:
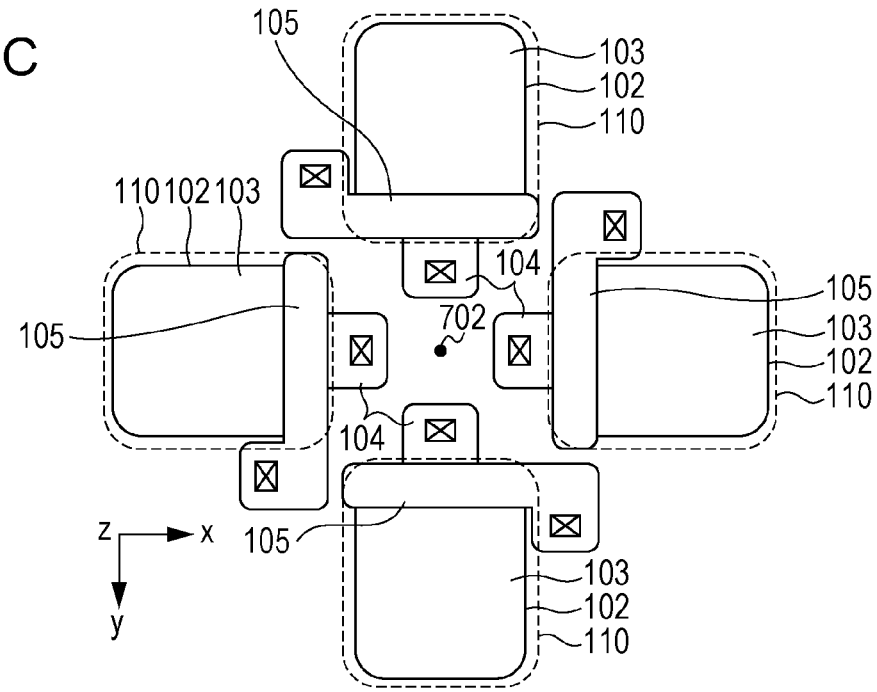
FIG. 7C is a schematic plan view for use in illustrating a modification of the solid-state image pickup apparatus according to the first exemplary embodiment.
Figure 8A:
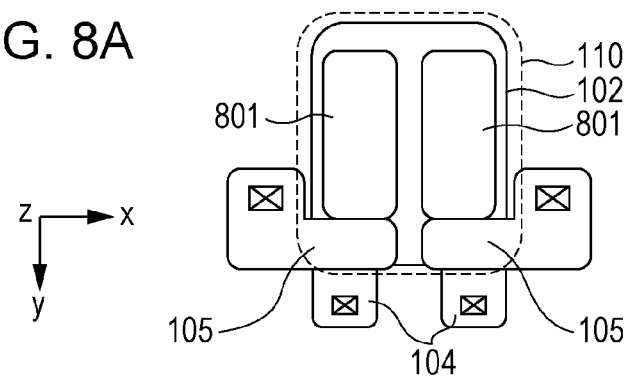
FIG. 8A is a schematic plan view for use in illustrating a modification of the solid-state image pickup apparatus according to the first exemplary embodiment.
Figure 8B:
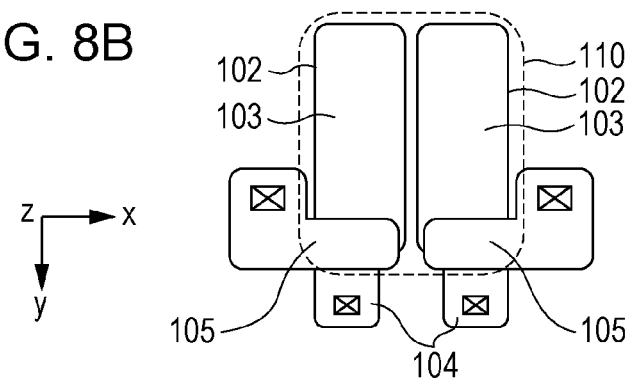
FIG. 8B is a schematic plan view for use in illustrating a modification of the solid-state image pickup apparatus according to the first exemplary embodiment.
Figure 8C:
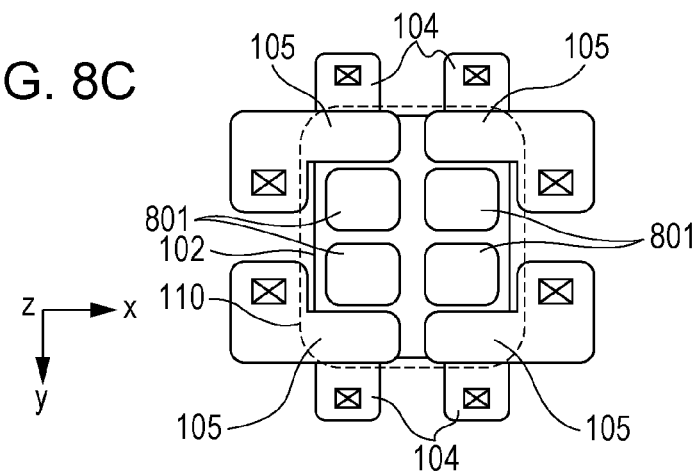
FIG. 8C is a schematic plan view for use in illustrating a modification of the solid-state image pickup apparatus according to the first exemplary embodiment.
Figure 8D:
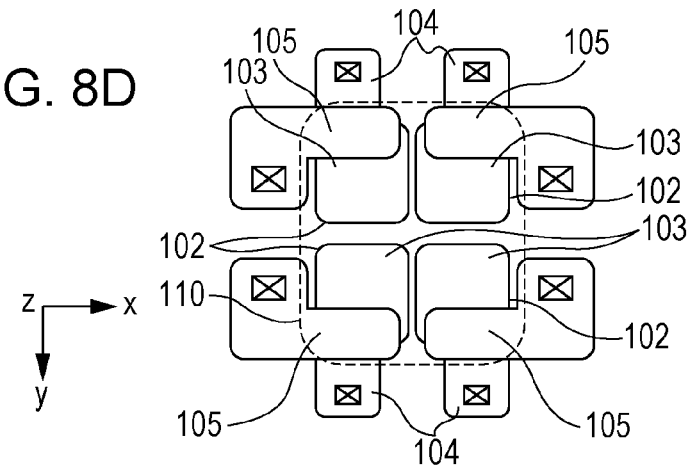
FIG. 8D is a schematic plan view for use in illustrating a modification of the solid-state image pickup apparatus according to the first exemplary embodiment.

In an example illustrated in FIG. 7A, unlike the configuration illustrated in FIG. 1A in which two sets are arranged in the y direction, two sets are arranged in the x direction. In an example illustrated in FIG. 7B, unlike the configuration illustrated in FIG. 1A in which two sets are arranged in a form of translational symmetry, two sets are arranged in a form of line symmetry about a virtual line 701. In an example illustrated in FIG. 7C, four sets are arranged about a point 702 such that each set is in a direction shifted by 90° from an adjacent set, i.e., the four sets are rotationally symmetric. In these configurations illustrated in FIGS. 7A to 7C, the insulating member 110 may be disposed in a similar manner to that in FIG. 1A. That is, the insulating member 110 may continuously extend such that the insulating member 110 covers the region above the photodiode 103 and the side faces and the upper surface of the transfer gate electrode 105, and the insulating member 110 may further protrude into a region above the FD region 104 such that the length protruding from the end of the transfer gate electrode 105 into the region above the FD region 104 is limited to 0.25 μm or less.

In examples illustrated in FIGS. 8A to 8D, a plurality of photodiodes 103 are covered with the same insulating member 110.

In the configuration described above with reference to FIG. 1A, the N-type semiconductor region 204 and the semiconductor region 205 forming one photodiode 103 are disposed in one active region. In contrast, in an example illustrated in FIG. 8A, one active region 102 includes two regions 801 in each of which an N-type semiconductor region 204 and a semiconductor region 205 are disposed. That is, two photodiodes 103 are disposed in one active region 102. One P-type semiconductor region 203 is disposed such that the two regions 801 share the P-type semiconductor region 203. Note that the regions 801 is isolated by the P-type semiconductor region. In an example illustrated in FIG. 8B, two photodiodes 103 are disposed such that one photodiode 103 is located in each of two active regions 102, and the two photodiodes 103 are covered with one insulating member 110. In an example illustrated in FIG. 8C, the number of regions 801 is increased from two in the example illustrated in FIG. 8A such that four regions 801 are disposed in one active region 102. In an example illustrated in FIG. 8D, four photodiodes 103 are disposed in four active regions 102 such that one photodiode 103 is disposed in one active region 102. In the configurations illustrated in FIGS. 8A to 8D, a plurality of photodiodes 103 are covered with one continuously extending insulating member 110. In each of these configurations, the insulating member 110 is also formed such that the insulating member 110 covers the region above the photodiode 103 and continuously extends therefrom to cover the side faces and the upper surface of the transfer gate electrode 105, and the insulating member 110 further protrudes into a region above the FD region 104 such that the length protruding from the end of the transfer gate electrode 105 into the region above the FD region 104 is limited to 0.25 μm or less. By employing these configurations, further finer structures are achieved.

In the configurations illustrated in FIGS. 8A to 8D, a plurality of photodiodes 103 may be covered with one microlens. These configurations make it possible to obtain a signal for use in focus detection. Also in the configurations illustrated in FIG. 7A to 7C, a plurality of photodiodes 103 may be covered with one insulating member 110 as with the configurations illustrated in FIGS. 8A to 8D.

The solid-state image pickup apparatus described above may be applied, for example, to a camera as described below. Note that the camera is not limited to an apparatus whose principal function is to take an image, but the solid-state image pickup apparatus may also be applied to apparatuses having an auxiliary function of taking an image. The camera may include a solid-state image pickup apparatus according to one of embodiments described above and a processing unit configured to process a signal output from the solid-state image pickup apparatus. The processing unit may include, for example, an A/D converter and a processor that processes digital data output from the A/D converter.

The embodiments of the invention allow the solid-state image pickup apparatus to have improved image quality. The embodiments and modifications described above may be changed and may be combined.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-018418 filed Jan. 31, 2012, which is hereby incorporated by reference herein in its entirety.

What is claimed is:

1. A solid-state image pickup apparatus comprising:
   a photoelectric conversion element;
   a floating diffusion region;
   a contact plug electrically connecting the floating diffusion region to an input node of an amplifying unit;
   a gate electrode disposed between the photoelectric conversion element and the floating diffusion region and configured to control an electrical conduction between the photoelectric conversion element and the floating diffusion region;
   a first insulating film continuously extending over at least part of the photoelectric conversion element and, at least part of the gate electrode and further protruding into a region above part of the floating diffusion region; and
   a second insulating film disposed above the first insulating film and continuously extending over the photoelectric conversion element, the gate electrode, and the floating diffusion region, wherein
   the first insulating film has a higher dielectric constant than the second insulating film; and
   an end of the first insulating film protruding from above the gate electrode into the region above the part of the floating diffusion region is located such that a distance of the end of the first insulating film from an end, on a side of the floating diffusion region, of the gate electrode is in a range equal to or less than 0.25 µm.

2. The solid-state image pickup apparatus according to claim 1, wherein
   the first insulating film includes a silicon nitride film, and
   the second insulating film includes a silicon oxide film.

3. The solid-state image pickup apparatus according to claim 1, further comprising an amplifying unit with an input node connected to the floating diffusion region.

4. The solid-state image pickup apparatus according to claim 1, wherein the floating diffusion region is a semiconductor region with an impurity concentration equal to or lower than $1\times10^{19}/cm^3$.

5. The solid-state image pickup apparatus according to claim 1, further comprising:
   a second photoelectric conversion element different from the photoelectric conversion element;
   a second floating diffusion region different from the floating diffusion region;
   a second gate electrode different from the gate electrode; and
   a microlens disposed above the second insulating film,
   wherein the microlens covers the photoelectric conversion element and the second photoelectric conversion element.

6. A camera comprising:
   the solid-state image pickup apparatus according to claim 1; and
   a processing unit configured to process a signal from the solid-state image pickup apparatus.

* * * * *